United States Patent [19]
Lee et al.

[11] Patent Number: 5,611,862
[45] Date of Patent: Mar. 18, 1997

[54] METHOD AND APPARATUS FOR MANUFACTURING HEAD DRUMS COATED WITH DIAMOND-LIKE CARBON COATING FILM USING HIGH-FREQUENCY PLASMA

[75] Inventors: Kwang-Ryeol Lee; Kwang-Yong Eun, both of Seoul, Rep. of Korea

[73] Assignee: Korea Institute of Science and Technology, Seoul, Rep. of Korea

[21] Appl. No.: 515,429

[22] Filed: Aug. 15, 1995

[30] Foreign Application Priority Data

Aug. 17, 1994 [KR] Rep. of Korea .................. 94-20259

[51] Int. Cl.$^6$ .................................................. C23C 16/00
[52] U.S. Cl. ........................................ 118/723 E; 118/728
[58] Field of Search ..................... 118/723 E, 723 ER, 118/728; 156/345; 204/298.08, 298.39; 313/231.31; 315/111.21

[56] References Cited

U.S. PATENT DOCUMENTS

| | | | |
|---|---|---|---|
| 4,438,188 | 3/1984 | Shimatani et al. ...................... | 430/128 |
| 4,501,766 | 2/1985 | Suzuki et al. .............................. | 427/38 |
| 4,615,299 | 10/1986 | Matsuyama et al. .................... | 118/723 |
| 4,648,348 | 3/1987 | Fujiyama ................................. | 118/723 |
| 4,676,195 | 6/1987 | Yasui et al. ............................. | 118/723 |
| 4,707,210 | 11/1987 | Misumi .................................... | 156/345 |
| 5,217,560 | 6/1993 | Kurono et al. .......................... | 156/345 |

OTHER PUBLICATIONS

Thin Solid Films, vol. 212, p. 240–244, 1992, H. Nakaue, et al., "Applications Of Diamond–Like Carbon Films To Electronic Components".

Nikkei Electronics Asia, pp. 40–41, Sep. 1993, S. Miyoshi, "10 Japanese, European VCR Makers Move To Standardize Digital HDTV VCR For Homes".

*Primary Examiner*—R. Bruce Breneman
*Assistant Examiner*—Joni Chang
*Attorney, Agent, or Firm*—Oblon, Spivak, McClelland, Maier & Neustadt

[57] ABSTRACT

An apparatus and method for simultaneously coating a large number of cylindrical substrates employs plural pairs of power electrode and the ground electrodes connected with an independent power sources in order to promote the uniform coating of the substrates. The apparatus uses a high-frequency plasma chemical deposition method and comprises a power supply system, a gas supply system, and a vacuum system. These systems are operatively connected to a reactor. The reactor comprises plural electrodes, workpiece supports, insulators, annular ground electrodes, gas outlets and gas supply means. The method comprises a step for stacking the substrates or the workpiece supports and combining them with the electrodes, a step for introducing gas to the reactor, a step for applying power to the power electrodes, and a step or maintaining the pressure in the reactor constant.

5 Claims, 3 Drawing Sheets

METHOD AND APPARATUS FOR MANUFACTURING HEAD DRUMS COATED WITH DIAMOND-LIKE CARBON COATING FILM USING HIGH-FREQUENCY PLASMA

BACKGROUND OF THE INVENTION

1. Field of the Invention

The present invention relates generally to a method for forming a coating layer on a cylindrical substrate using a high-frequency plasma chemical deposition technique and, more particularly, to a method and apparatus for simultaneously forming uniform coating layers on a large number of cylindrical substrates using multiple pairs of power supplied electrodes and ground electrodes which are disposed in a formation for achieving uniform synthesis of the coating layers.

2. Description of the Related Art

Recently, intensive researches have been made in order to improve the abrasion resistance and lubricity of a VCR head drum. For example, in the Report of Korean Ministry of Science and Technology BSU1434-4943-1, a method for increasing the abrasion resistance and lubricity of a head drum while preventing the damage of VCR tape had been disclosed. The technique for synthesizing diamond-like carbon film is generally divided into 4 categories: plasma chemical deposition, sputtering, ion beam synthesis, and laser ablation.

According to an article published in the Transaction of Korean Metallurgical Society, 6(4), 345(1993) by K. R. Lee and K. Y. Eun, the plasma chemical deposition method has a number of practical advantages. (1) This method is adapted for coating a substrate having complex configurations. (2) This method uses simple apparatuses which do not require experience for its operation. (3) This method reduces the coating cost because it does not require a high degree of vacuum and uses methane gas as the main carbon source.

However, according to the aforementioned article, a diamond-like carbon film has optical transparency, which causes the interference color generated by the coated film to differ depending on the thickness of the film. Therefore, it is very important to maintain a uniform synthesis rate along the circumference of a head drum for producing coated head drums having the same color.

A technique for obtaining an uniform coating layer along the circumference of a head drum is described in Korean Patent Application No. 94-18059 invented by the inventors of the present application and assigned to the assignee of the present application. In this technique, a diamond-like carbon film is synthesized using cylindrical plasma generated around the head drum by applying high-frequency electrical power to the stacked cylindrical head drums and disposing an annular ground electrode in the form of a concentric circle surrounding the stacked head drums. By using this synthesizing technique, a very uniform plasma can be generated along the circumference of the head drums, which allows the uniform synthesis of coating layers without requiring additional manipulation such as rotating the head drums.

FIG. 1 shows an embodiment of an high-frequency plasma chemical deposition apparatus 10 using only one pair of electrodes. This embodiment is also disclosed in '059 Korean Patent Application. This synthesizing apparatus generally comprises a reactor 10-1, a power supply system 10-2, a gas supply system 10-3, and a vacuum system 10-4. The reactor 10-1, which is in a vacuum state, comprises an electrode 1a disposed at the center of the reactor for supplying power and a conductive workpiece support 1b on which VCR head drums are stacked. The workpiece support 1b is attached to the electrode 1a to form power supply electrode 1. An annular shield type ground electrode 3 is disposed in the form of a concentric circle spaced 1–10 cm from the cylindrical surface of the head drums. To the reactor 10-1, the following systems are connected: a power supply system 10-2 for supplying power to the electrode 1a and for monitoring the electrical characteristics thereof; a gas supply system 10-3 for providing the source material in the gaseous state for the synthesis; and a vacuum system for maintaining a vacuum state and for controlling the pressure in the reactor. Both the workpiece support 1b and the head drum are made of a conductive material. Thus, when the electrical power is supplied to power supply electrode 1 through power supply system 10-2 and the source gas is introduced into reactor 10-1, the plasma of the source gas is generated between ground electrode 3 and the surface of the stacked head drums. The source gas decomposed by the plasma is deposited on the head drum substrate in the form of diamond-like carbon film.

On the other hand, to coat a large number of head drums simultaneously using a synthesizing apparatus having one pair of electrodes, more number of head drums have to be stacked and, therefore, the length of electrode has to be extended. The extension of the electrode causes a number of problems as follows: (1) The temperature of the electrode increases sharply owing to the large quantity of electrical power applied thereto, which causes problems in the vacuum sealing and results in the deformation of the stacked head drums adjacent to the electrode; (2) Very stiff temperature gradient generates between the stacked head drums because the workpiece support cannot be cooled by the circulation of coolant. Therefore, the property of the synthesized film greatly differs according to the location; (3) The composition of plasma varies because the uniform generation of plasma along the longitudinal direction of electrode becomes more difficult and the difference in the distribution of source gas becomes great along the length of electrode; (4) In order to form an uniform plasma in the circumferential direction, the space between the ground electrode and the surface of the head drum must be uniform. But, as the electrode becomes longer, the fabrication of a ground electrode having precise circular cross section becomes more difficult; (5) The long length of the workpiece support interferes the mounting of the head drums.

When a large number of head drums is simultaneously coated by a synthesizing apparatus having one pair of electrodes, damage to the head drum may occur which results in difficulty in obtaining a coating layer having uniform thickness because of the non-uniform synthesizing rate. These problems hinder the commercial use of this apparatus.

Therefore, a need exists in the art for an apparatus that can coat a large number of cylindrical substrates simultaneously with uniform coating rate.

SUMMARY OF THE INVENTION

The principal object of the present invention is to provide a synthesizing apparatus adapted to perform a coating operation on a large number of head drums simultaneously with uniform rate using a plasma chemical deposition method.

A further object of the present invention is to provide an apparatus comprising multiple power electrodes each connected to an independent, high-frequency power source, which is capable of performing uniform coating on a large number of head drums at a time. This apparatus provides a solution to the problem of the prior art synthesizing apparatus which employs a single pair of electrodes.

A further object of the present invention is to provide a method for performing uniform coating on a large number of head drums simultaneously by means of a synthesizing apparatus comprising multiple pair of electrodes.

In accordance with one aspect of the present invention, the aforementioned and other objects are accomplished by providing a plasma chemical deposition apparatus comprising: a gas supply system for supplying the source gas to the reactor; a vacuum system for maintaining a vacuum state and controlling the pressure in the reactor; a power supply system including a multiple high-frequency power source and a controller connected to the multiple high-frequency power source; and a vacuum reactor in which a diamond-like carbon film is formed. The vacuum reactor in turn comprises the following elements: multiple electrodes each connected to a different high frequency power source; multiple conductive workpiece supports for stacking the objects to be processed thereon, which consists of multiple conductors each attached to one of the electrodes to form a power electrode together; multiple annular ground electrodes each disposed on a concentric circle spaced from the surface of cylindrical objects stacked on one of the workpiece supports by a predetermined distance; insulators for insulating the multiple electrodes and the workpiece supports attached thereto from the reactor; gas outlets disposed on the outer surface of the ground electrode at equal intervals; gas inducting tube extending from the top of the reactor to the bottom of it for introducing the source gas into the reactor from the gas supply system; and gas supply ring for uniformly distributing the introduced source gas.

According to the apparatus and method of the present invention, the interaction between the power electrodes is minimized. Therefore, uniform coating of a large number of cylindrical objects can be accomplished without extending the length of the electrode.

Other features and advantages of the present invention will be apparent from the following more detailed description of the preferred embodiment, taken in conjunction with the accompanying drawings, which illustrate, by way of example, the principles of the present invention.

DETAILED DESCRIPTION OF THE INVENTION

Figure 1:
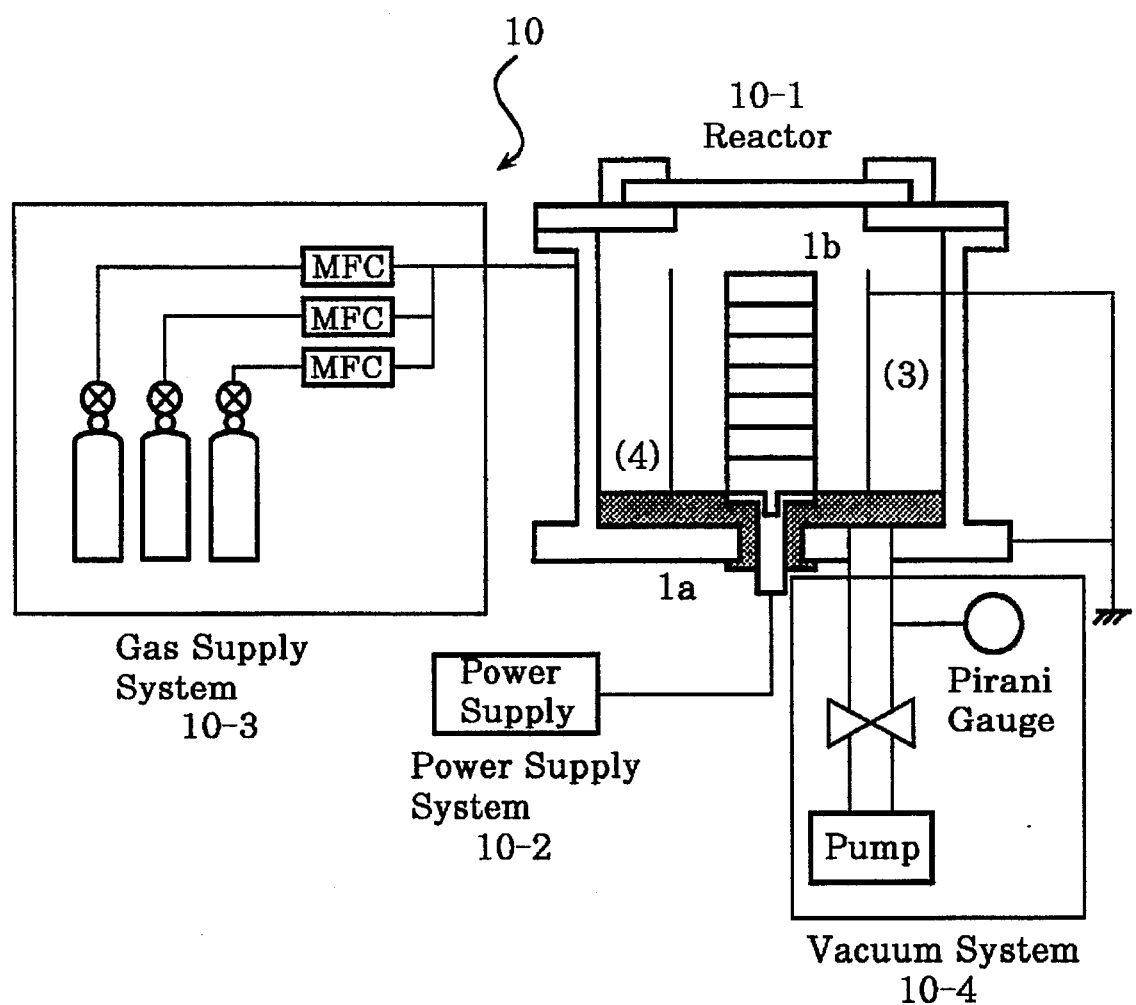
FIG. 1 is a vertical sectional view of a prior an single-pair electrode high frequency chemical deposition apparatus.
Figure 2A:
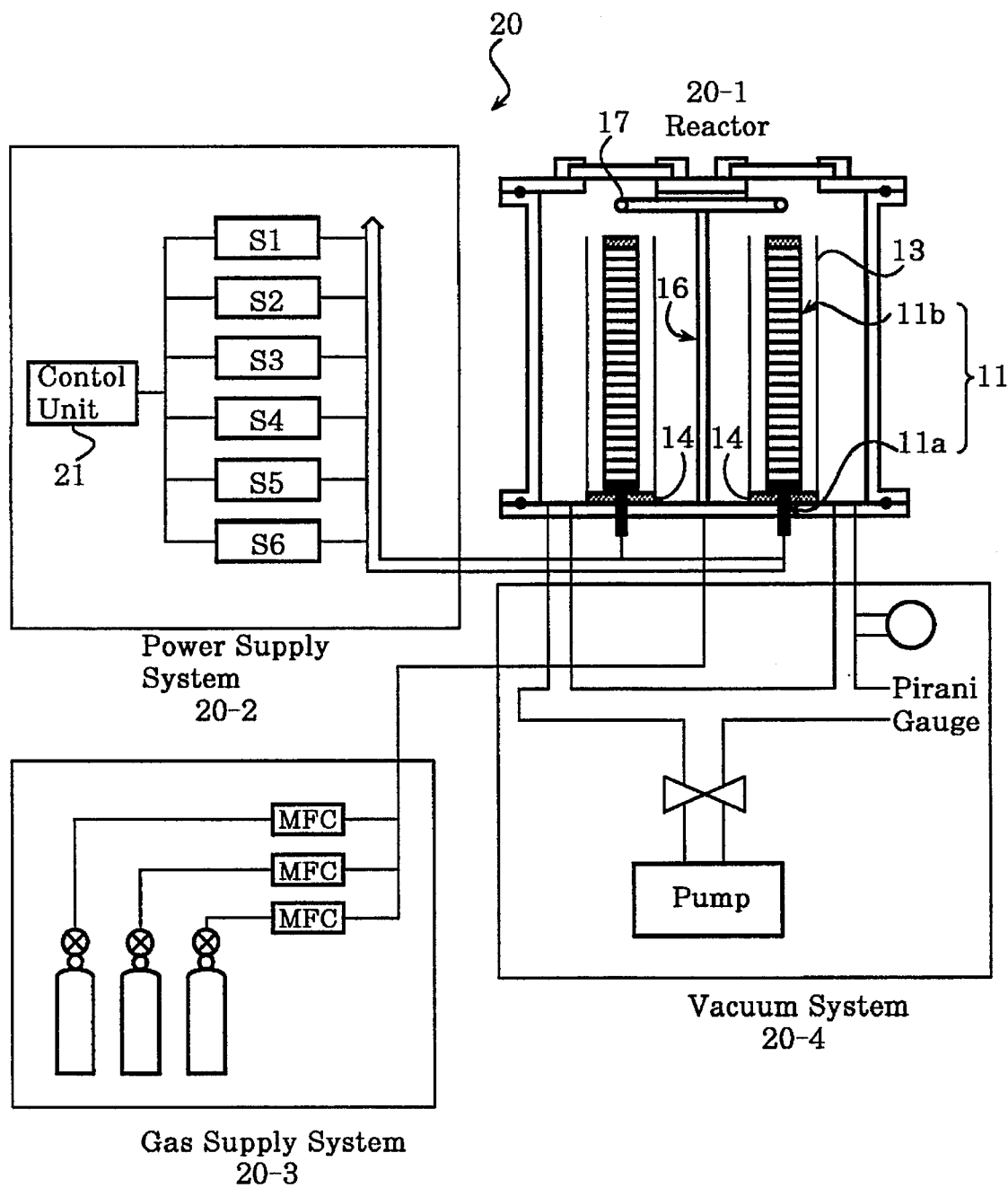
FIG. 2a is a vertical sectional view of the multi-pair electrode high frequency chemical deposition apparatus according to the present invention.
Figure 2B:
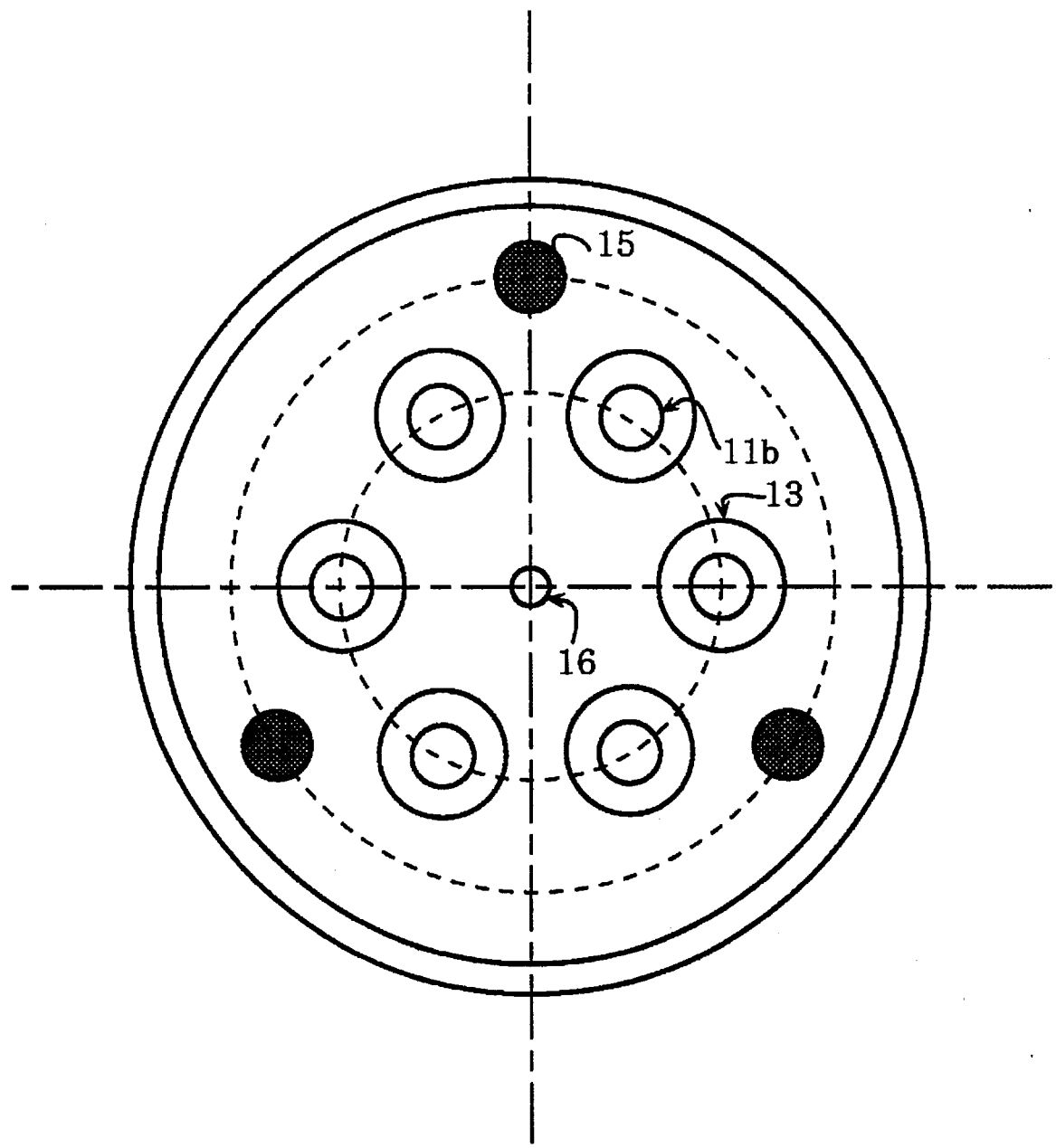
FIG. 2b is a horizontal sectional view of the reactor of the multi-pair electrode high frequency chemical deposition apparatus according to the present invention.

In FIG. 2, a preferred embodiment of the high-frequency chemical deposition apparatus 20 having multiple pairs of electrodes according to the present invention is shown. FIG. 2a is a schematic diagram of the synthesizing apparatus showing the vertical structure of the reactor according to the present invention. FIG. 2b is a horizontal sectional view of the reactor 20-1. As illustrated in FIG. 1, the synthesizing apparatus according to the present invention generally consists of four components: a reactor 21-1, a power supply system 20-2, a gas supply system 20-3, and vacuum system 20-4. Among them, the gas supply system 20-3 and the vacuum system 20-4 are identical to the corresponding components of the plasma CVD synthesizing apparatus disclosed in Korean Patent Application No. 94-201, "A Method for Forming Diamond-like Carbon Film" filed on Jan. 7, 1994 by the assignee of the present application.

First of all, the detailed structure of the reactor 20-1 is explained. At the bottom of the reactor, multiple electrodes 11a are disposed on the multiple (number of n) identical circles located at equal intervals. Theses electrodes 11a-1, . . . , 11a-n are insulated from the reactor 20-1 by insulators 14. For the convenience of explanation, the number of electrodes is assumed to be 6. On these electrodes 11a-1, 11a-6, workpiece supports 11b-1, . . . , 11b-6 are mounted respectively to form . . . 6 power supply electrodes 11-1, . . . , 11-6. On the concentric circles spaced by 1–10 cm from the power supply electrodes 11-1, . . . , 11-6, 6 ground electrodes 13-1, . . . , 13-6 are disposed. The ground electrodes are electrically connected with the reactor 20-1, and thereby the reactor 20-1 is grounded. To allow the source gas to flow smoothly, each ground electrode 13 is a shield type electrode having a number of holes. As illustrated in FIG. 2b, at the outer surface of each ground electrode 13, gas outlets are formed at equal intervals. At the center of the reactor 20-1, a gas inducting tube 16 extending to the top of the reactor is provided, and a shower head shape gas supply ring 17 is attached to the top of the gas inducting tube 16 in order to promote uniform gas distribution.

Power supply system 20-2 is constructed as illustrated in FIG. 2a. This systems consists of plural (i.e. six) high frequency power sources S1–S6 and one controller 21. Each of the six electrodes 11a disposed in the reactor 20-1 is independently connected with one of-the six high frequency power sources S1–S6. This is to prevent the non-uniformity of the applied current caused by the impedance differences between the electrodes, which occur when the six electrodes are connected to a common current source. These six power sources S1–S6, as illustrated in FIG. 2a, are connected to one controller 21, thus, both the voltage and the current applied to the electrode 11a from the high frequency power source S1–S6 is controlled simultaneously. Furthermore, when the impedance difference exists between the electrodes, it can be compensated by controlling the high frequency power source 51-56 independently.

According to the present invention, for coating a large number of head drums simultaneously, multiple electrodes were employed instead of extending the length of the electrode with the view to avoid a number of problems caused by the extension of the electrodes' length. Furthermore, the electrical interaction between the electrodes is minimized and the uniform synthesis rate in the direction of circumference can be obtained by providing annular ground electrodes 13 which are adapted to the cylindrical shape of the substrate being coated and coaxial to the corresponding center axis of the power electrodes. Each of the ground electrodes constitute an electrode pair with its corresponding power electrode 11. And, by connecting each power electrode with an independent high frequency power source, an identical amount of current is applied to each power electrode without being affected by the impedance difference between power electrodes, which regulates the uniform coating rate of the head drums. Therefore, according to the present invention, a large number of head drums is able to be coated simultaneously with a uniform coating rate by a synthesizing apparatus having multiple pairs of electrodes.

In the above, the present invention has been described in regards to an embodiment employing six electrodes. This embodiment, however, was discussed as an exemplification and does not limit the scope of the invention in any sense. The number of electrodes and the number of the components pairing with the electrodes can be increased or reduced according to the requirement. In this specification, the electrodes have been described to be located on the same circle at equal intervals. However, the synthesizing method according to the present invention can be performed independently on the basis of the pair of power electrode 11 and ground electrode 13, and accordingly, any formation of the electrode is possible as long as it results in a uniform gas supply.

In the foregoing, the synthesizing apparatus for forming diamond-like carbon film on a VCR head drum had been described. The scope of the invention, however, is not limited to the synthesis of diamond-like carbon film by means of plasma CVD method. This invention can be generally exploited to form a coating layer of any material on a cylindrical substrate through plasma processing.

Described below is a preferred embodiment of a method for forming diamondlike carbon films on a substrate, i.e. a head drum, by means of the synthesizing apparatus described above.

Prior to performing required synthesis on a VCR head drum, the drum surface must be cleaned using Argon plasma. The cleaning process is as follows. 240 VCR head drums each having a 62 mm diameter and a 13 mm height are stacked on the six workpiece supports 11$b$ having a length of 750 mm (40 head drums per workpiece support). Then, the workpiece supports is mounted on the electrode as illustrated in FIG. 2. In the next step, the reactor 20-1 is evacuated below the pressure of $10^{-3}$ Torr. After that, Argon gas is introduced to the reactor at the rate of 100 sccm while maintaining the pressure in the reactor within the range of 0.1 to 1.0 Torr, preferably 0.2 Torr. Then, high frequency power is applied to the reactor by adjusting the power control unit, which generates Argon plasma in the reactor.

As a result of the cleaning, it was observed that the plasma current of each electrode became uniform soon after the initiation of the cleaning process. Before the cleaning process, the plasma current had differences of about 0.2 A between the electrodes due to the different surface condition of the electrodes. This kind of plasma behavior is possible because an independent power source was used for each electrode which minimizes the current differences between the electrodes caused by the impedance differences between the electrodes. In the cleaning process, a high frequency current of 1 A was applied to the electrode, and the temperature of the electrodes did not exceed 100° C.

After the cleaning process, a diamond-like carbon film is deposited by supplying pure methane gas to the synthesizing apparatus having multi-pair electrodes depicted in FIG. 2. The introduction of the methane gas can be performed at a rate ranging from 50 sccm to 500 sccm. A power source having a frequency within the wide range of 100 kHz to 10 MHz can be used as the high frequency current source. At the same time, the voltage applicable by the high frequency current source should exceed 200 V. If impedance differences exist be compensated by adjusting the high frequency current sources which are connected to each electrode independently. This compensation assures that the power applied to each electrode 11$a$ do not exceed 1 kW. The coating of carbon film is performed using the plasma chemical deposition method under a fixed synthesizing pressure within the range of 0.1 Torr to 1.0 torr.

The inventors of the present invention performed coating of a thin film using the method described above for 5 minutes with a 1.3 A synthesizing current having 700 V voltage. In order to confirm the advantageous effect of the present invention, the thickness of the coated film was measured by means of the color variation between the coated heads drum caused by the interference of light. The test results showed that the current difference between the electrode did not exceed 0.1 A, and every head drum showed the same orange color, which was very uniform throughout the circumference of the head drums. The synthesized film showed the chemical composition and atomic bonding structure of a typical diamond-like carbon film. The hardness of the carbon film was over 2000 kgf/mm$^2$ and the contact friction coefficient between the drum and tape was below 0.15, which are excellent physical property characteristics for a carbon film. In addition, during the synthesizing process of the present invention, the temperature of the electrodes did not exceed 150° C.

It is understandable from the embodiment described above that a large number of head drums are coated with a single operation without causing an abrupt increase in the electrode temperature which is encountered when coating a large number of head drums using a synthesizing apparatus having a single apparatus. Therefore, the problems concerning the sealing can be avoided. Furthermore, the uniform application of current to each electrode can be accomplished with ease by controlling the high frequency current source through a control unit and, when there exist differences between the applied currents, the magnitude of the currents applied to the electrodes can be made uniform by adjusting the current sources independently. As a result, the thickness of the film coated on the head drum can be rendered uniform.

In the embodiment described above, methane gas was used as the carbon source. However, it is to be noted that any kind of carbohydrate consisting of carbon and hydrogen may also be used as the carbon source.

It will, of course, be understood that modifications of the present invention and its various aspects will be apparent to those skilled in the art. As such, the scope of the invention should not be limited by the particular embodiment herein described but should be defined only by the appended claims and equivalents thereof.

What is claimed is:

1. An apparatus for forming coating films on a large number of cylindrical substrates simultaneously using a high frequency plasma chemical deposition method comprising:

a reactor;

a power supply system electrically connected to said reactor;

a gas supply system supplying source gas to said reactor; and a vacuum system maintaining a vacuum state and controlling a pressure in said reactor within a range of 0.1 Torr to 1.0 Torr during a film synthesizing process; wherein, said power supply system comprises multiple high-frequency current sources having a frequency within a range of 100 kHz to 10 MHz and a control unit connected to the multiple high-frequency current sources, said reactor comprises a plurality of electrodes each of which is connected with a different high-frequency current source, a plurality of electrically conductive workpiece supports which are combined with said plurality of electrodes respectively to form power electrodes and used to stack cylindrical substrates thereon, a plurality of insulators respectively insulating said plurality of electrodes and said workpiece supports from said reactor, and a plurality of annular ground electrodes disposed in a form of concentric circles spaced from an outer surface of said cylindrical substrates by a distance and electrically connected with said reactor, wherein said power electrodes are disposed in a formation which minimizes interaction between the power electrodes.

2. The apparatus recited in claim 1, wherein said reactor further comprises gas outlets disposed at outside of said ground electrode at equal intervals, a gas inducting tube extending from a top of said reactor to a bottom thereof for inducting source gas into said reactor, and a gas supply means for allowing uniform gas distribution within said reactor.

3. The apparatus recited in claim 2, wherein said gas supply means has a ring configuration.

4. The apparatus recited in claim 1, wherein said annular ground electrode is a shield type electrode.

5. The apparatus recited in any one of claims 1 to 4, the distance from the outer surface of said substrates to said annular ground electrode disposed on a concentric circle is within a range of 1–10 cm.

* * * * *